United States Patent [19]

Ohashi et al.

[11] Patent Number: 5,046,655
[45] Date of Patent: Sep. 10, 1991

[54] DEVICE FOR DETECTING HEIGHT OF BONDING SURFACE

[75] Inventors: Yuji Ohashi; Yoshimitsu Terakado; Minoru Torihata; Hiroshi Ushiki, all of Tokyo, Japan

[73] Assignee: Kabushiki Kaisha Shinkawa, Tokyo, Japan

[21] Appl. No.: 422,988

[22] Filed: Oct. 16, 1989

[30] Foreign Application Priority Data

Oct. 18, 1988 [JP] Japan .................................. 63-260448

[51] Int. Cl.$^5$ .................................... H01L 21/60
[52] U.S. Cl. ...................... 228/9; 228/102; 228/4.5
[58] Field of Search .................... 228/8–10, 228/4.5, 102, 110, 179, 1.1

[56] References Cited

U.S. PATENT DOCUMENTS

| 4,109,846 | 8/1978 | Pennings et al. | 228/9 |
| 4,598,853 | 7/1986 | Hill | 228/4.5 |
| 4,653,681 | 3/1987 | Dreibelbis et al. | 228/102 |
| 4,718,591 | 1/1988 | Hill | 228/1.1 |

FOREIGN PATENT DOCUMENTS

| 54645 | 3/1983 | Japan | 228/4.5 |
| 184734 | 10/1983 | Japan | 228/4.5 |
| 214441 | 9/1986 | Japan | 228/4.5 |
| 290730 | 12/1986 | Japan | 228/4.5 |

*Primary Examiner*—Samuel M. Heinrich
*Attorney, Agent, or Firm*—Koda and Androlia

[57] ABSTRACT

A bonding height detecting device used in a wire bonding machine which includes a rotatable axle provided on a bonding head, a moving block pivotally mounted on the rotatable axle, a bonding arm fixed on the rotatable axle, and a bonding tool attached to one end of the bonding arm through which a bonding wire is passed. The detecting device includes a lever fixed on the rotatable axle and having a first stopper and a detecting surface, a second stopper fixed on the moving block so that the second stopper is urged to contact the first stopper, a sensor fixture attached to the second stopper, and a proximate sensor mounted on the sensor mixture and facing the detecting surface of the lever.

1 Claim, 2 Drawing Sheets

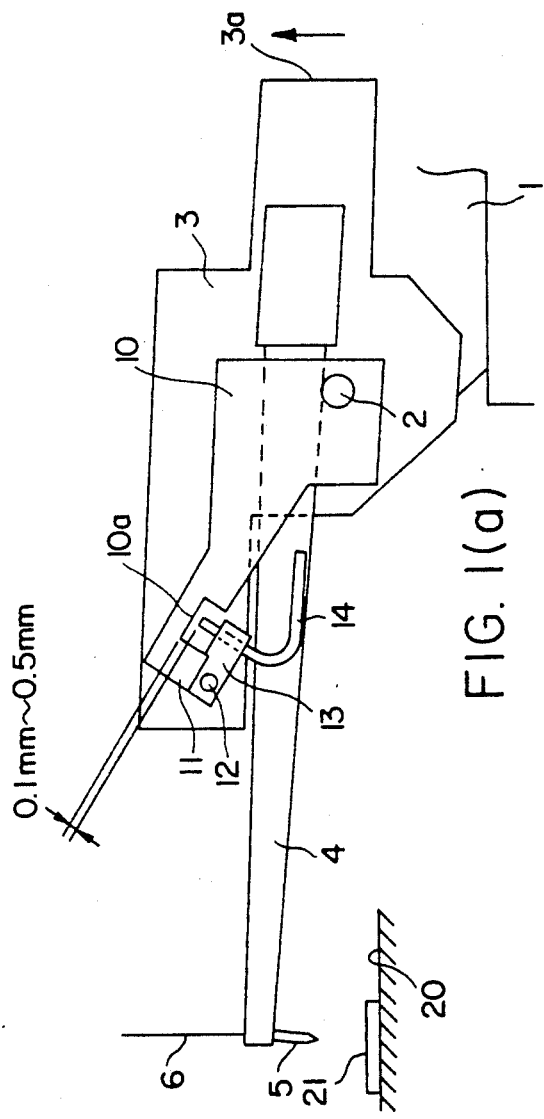
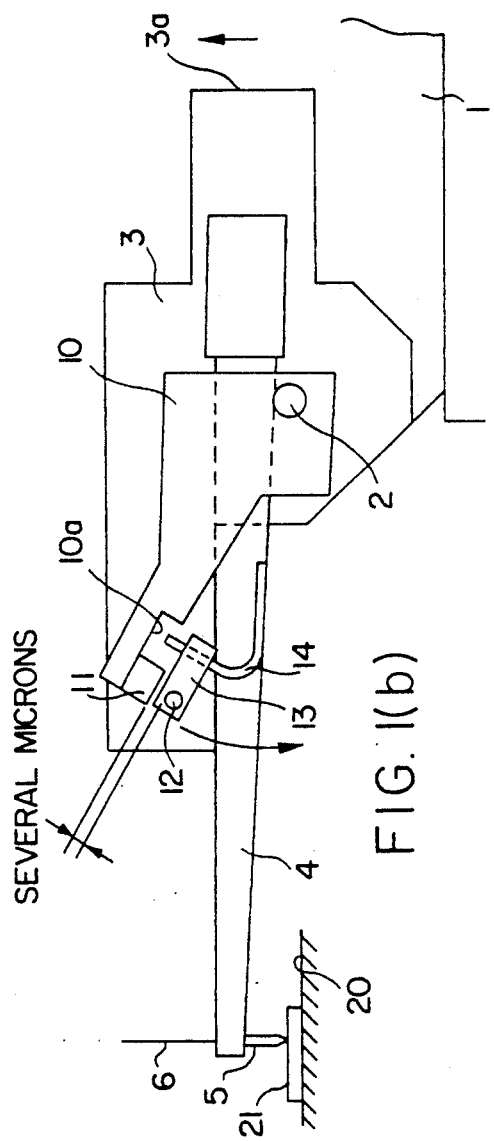
FIG. 1(a)
FIG. 1(b)

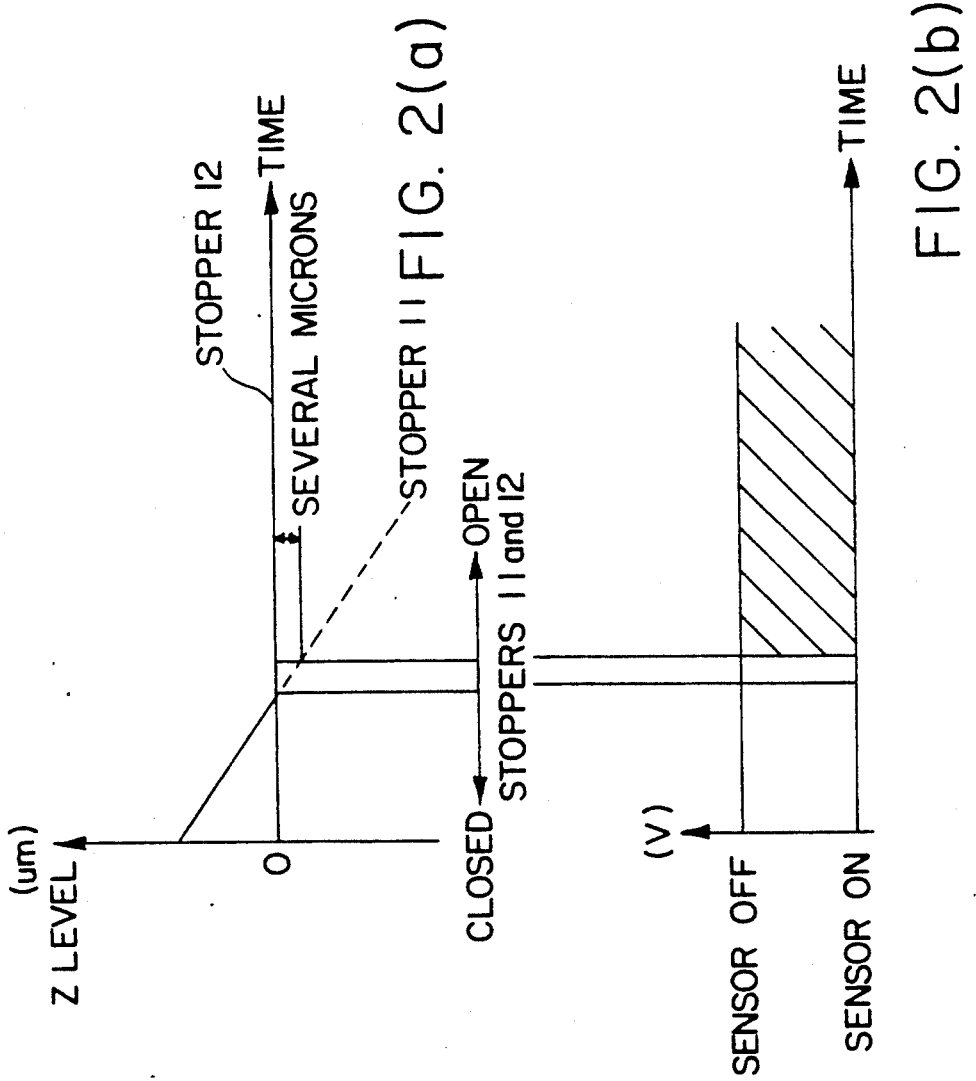

DEVICE FOR DETECTING HEIGHT OF BONDING SURFACE

BACKGROUND OF THE INVENTION

1. Field of the Invention

The present invention relates to a device for detecting the height of a bonding surface used in a wire bonding machine.

2. Prior Art

Conventional detectors for detecting the height of a bonding surface in a bonding machine for semiconductors include, for example, the apparatus described in Japanese Patent Publication No. 57-58054.

This apparatus comprises a bonding tool through which a bonding wire is passed, a bonding arm which holds the bonding tool, a vertically moving block which moves up and down and to which the bonding arm is fastened so that the bonding arm is free to pivot, a first contact fastened to the bonding arm or to a lever which is attached to the bonding arm, and a second contact which is fastened to the vertically moving block so that the second contact faces the first contact. An electrical current is applied to the two contacts, and the position at which the bonding tool contacts the bonding surface is detected by means of the ON-OFF action of the contacts.

Specifically, when the bonding tool is lowered in the Z direction (the perpendicular direction) so that the bonding tool contacts the bonding surface, the contacts are opened (separated). Contact of the bonding tool with the bonding surface is confirmed by the opening and closing of the contacts, and a standard programmed amount of "sink-in" is determined.

In the abovementioned prior art, the bonding surface is detected by the opening and closing action of the contacts. As a result, the following problems arise:

When the contacts open or close, they generate minute amount of chatter. As a result, confirmation of the opening of the contacts may be delayed, or errors in operation may occur. This causes unstable "sink-in" to occur.

Furthermore, the material used for the contacts must have good electrical characteristics, (such as a material formed by applying gold plating to an alloy of silver and titanium or an alloy of beryllium and copper, etc.) which accurately detects the opening and closing of the contacts by causing a minute electric current to flow therethrough. Accordingly, the contact material is inferior in terms of wear resistance. As a result, not only does stable detection become impossible as the frequency of opening and closing of the contacts increases, but mechanical discrepancies may also occur.

SUMMARY OF THE INVENTION

The object of the present invention is to provide a device for detecting the height of a bonding surface which allows a stable bonding surface detection, thus allowing stable bonding.

The object of the present invention is achieved by providing a proximity sensor so that the sensor can detect the distance between a bonding arm and a vertically moving block. More specifically, in the present invention a proximity sensor is provided on a bonding arm or a part attached thereto so that the sensor is in close proximity to a vertically moving block or to a part attached thereto. Conversely, the object of the present invention can also be achieved by fastening a proximity sensor to the vertically moving block or to a part attached thereto so that the sensor is in close proximity to the bonding arm or to a part attached thereto.

With this structure, the vertically moving block is first lowered so that the bonding tool contacts the bonding surface. When the vertically moving block is lowered further from this point, the bonding arm is not lowered any further, since the tip of the bonding tool is in contact with the bonding surface. Accordingly, the vertically moving block alone continues to be lowered, and a gap opens between the proximity sensor and the detection surface which faces the sensor. When this gap reaches a predetermined distance, a signal is output by the proximity sensor so that the most appropriate bonding load is imparted to the bonding tool.

BRIEF DESCRIPTION OF DRAWINGS

FIG. 1(a) is a front view of the essential parts of the device of the present invention where the bonding tool is not in contact with a bonding surface;

FIG. 1(b) is a front view thereof with the bonding tool in contact with the bonding surface;

FIG. 2(a) shows a positional relationship between two stoppers over time; and

FIG. 2(b) illustrates an output signal of a proximity sensor with respect to the time.

DETAILED DESCRIPTION OF THE INVENTION

An arm-supporting shaft 2 is supported so that the shaft 2 is free to rotate on a bonding head 1 which is moved in the X and Y directions by a driving means (not shown). A vertically moving block 3 is held by this arm-supporting shaft 2 so that the moving block 3 is free to pivot around the shaft 2. A pivot end 3a of the vertically moving block 3 is located at the rear end of the vertically moving block 3 and caused to pivot by a driving means (not shown).

A bonding arm 4 is fastened to the arm-supported shaft 2 and holds a bonding tool 5 at one end through which a bonding wire 6 is supplied onto a pallet 21. The bonding wire 6 is reeled out of a spool (not shown). The above structure is a well known design, and accordingly, a further description is omitted here.

A lever 10 is provided on the arm-supporting shaft 2, and a stopper 11 is fastened to this lever 10. A sensor detection surface 10a is formed near the stopper 11 on the lever 10.

A cylindrical stopper 12 is attached to the vertically moving block 3 so that it comes in contact with the stopper 11, and a sensor-fastening block 13 is provided on this stopper 12. A proximity sensor 14 is attached to the sensor-fastening block 13 so that it faces the sensor detection surface 10a.

A spring (not shown) is installed between the vertically moving block 3 and the lever 10, or between the vertically moving block 3 and the bonding arm 4, so that the two stoppers 11 and 12 press against each other as seen in FIG. 1(a). When the two stoppers 11 and 12 are in contact with each other, the proximity sensor 14 is held so that a gap of approximately 0.1 to 0.5 mm is maintained between the proximity sensor 14 and the sensor detection surface 10a.

A lead frame 20 is guided and fed by a sample-carrying table (not shown), and a pellet 21 is bonded to the lead frame 20.

Next, operation of the present invention will be described with reference to FIG. 2.

The movement of the bonding head 1 in the X and Y directions (i.e. the movement of the bonding tool 5 in the X and Y directions) and the movement of the vertically moving block 3 in the Z direction (i.e., the movement of the bonding tool in the Z direction) are accomplished by the prior art method. Accordingly, the movement of these components will not be described herein.

When the pivot end 3a is elevated from the position illustrated in FIG. 1(a), the vertically moving block 3 pivots about the arm-supporting shaft 2. As a result, the bonding tool 5 contacts the bonding surface of the pellet 21 or lead frame 20. Up to this point, the stoppers 11 and 12 remain in contact with each other as shown in FIG. 2(a).

When the pivot end 3a is further elevated from this point in the direction indicated by the arrow, the bonding arm 4 alone remains horizontal (between the arm-supporting shaft 2 and the bonding tool 5). Meanwhile, the vertically moving block 3 alone pivots counterclockwise about the arm-supporting shaft 2 as shown in FIG. 1(b). As a result, contact between the stoppers 11 and 12 is broken, and the gap between the sensor detection surface 10a and the proximity sensor 14 increases.

When the gap between the stoppers 11 and 12 exceeds a certain predetermined set value (several microns as shown in FIG. 1(b)), the proximity sensor 14 outputs a signal as shown in FIG. 2(b). Using this output signal as a standard, the vertically moving block 3 is caused to pivot further about the arm-supporting shaft 2 so that the bonding tool 5 is lowered. In other words, the "sink-in" of the bonding tool 5 is set in this manner. As a result, the bonding load with which the bonding tool 5 presses the wire 6 against the bonding surface is set at an optimal value.

As seen from the above, contact of the bonding tool 5 with the bonding surface is detected by the stoppers 11 and 12 which are a few microns apart in stable positions. Thus, stable bonding is performed. Furthermore, since the stoppers 11 and 12 do not act as bonding (surface) detection contacts as seen in the prior art, a material which is superior in terms of wear resistance (such as super-hard steel, etc.) can be used for the stoppers 11 and 12. Thus, the mechanical precision of the apparatus is improved and maintenance-free operation is achieved.

Furthermore, in the embodiment described above, the vertically moving block 3 is caused to pivot about the arm-supporting shaft 2. However, it would also be possible to cause the block 3 to move straight up and down. Moreover, in the above embodiment, the proximity sensor 13 is provided on a sensor-fastening block 13 which is fastened to the vertically moving block 3 via the stopper 12. It would also be possible, however, to fasten the proximity sensor 14 to the lever 10.

As is clear from the above description, the present invention makes it possible to detect contact of the bonding tool with the bonding surface by means of a proximity sensor in a non-contact state. Stable bonding surface detection can be achieved, the mechanical precision of the apparatus is improved and the apparatus can be used without any special maintenance requirements.

We claim:

1. A device for detecting the height of a bonding surface used in a wire bonding machine which comprises a rotatable shaft provided on a bonding head, a vertically moving block pivotally mounted on said rotatable shaft, a bonding arm fixed on said rotatable shaft, and a bonding tool provided at one end of said bonding arm, said height detecting device comprising:

a lever fixed on said rotatable shaft, said lever including a first stopper at one end and a detecting surface near said first stopper;

a second stopper provided on said vertically moving block, said second stopper being urged to contact said first stopper;

a sensor fixture fixed on said second stopper; and a proximity sensor mounted on said sensor fixture, said sensor facing said detecting surface.

* * * * *